United States Patent
Kojima et al.

(10) Patent No.: US 6,881,653 B2
(45) Date of Patent: Apr. 19, 2005

(54) METHOD OF MANUFACTURING CMOS SEMICONDUCTOR DEVICE

(75) Inventors: Manabu Kojima, Kawasaki (JP); Kenichi Goto, Kawasaki (JP); Hiroshi Morioka, Kawasaki (JP); Kenichi Okabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/740,430

(22) Filed: Dec. 22, 2003

(65) Prior Publication Data
US 2004/0132240 A1 Jul. 8, 2004

(30) Foreign Application Priority Data
Dec. 27, 2002 (JP) .................................. 2002-381697

(51) Int. Cl.$^7$ .............................................. H01L 21/20
(52) U.S. Cl. ...................... 438/491; 438/162; 257/69
(58) Field of Search ........................ 257/57, 66–70, 257/19, 28; 438/150–166, 306, 532, 550–564, 482–491

(56) References Cited

U.S. PATENT DOCUMENTS

| | | | |
|---|---|---|---|
| 5,489,542 A | * 2/1996 | Iwai et al. | ............... 438/287 |
| 6,300,206 B1 | * 10/2001 | Fukada et al. | ............. 438/303 |
| 6,387,784 B1 | 5/2002 | Chong et al. | |

FOREIGN PATENT DOCUMENTS

JP     6-310666     11/1994

OTHER PUBLICATIONS

Sugatani et al., "Requirements for Dry Process of 100 nm, node CMOS Integration", Dry Process International Symp. 2002, p255–262.

Wen–Chin et al.; Observation of Reduced Boron Penetration and Gate Depletion for Poly–Si$_{0.8}$Ge$_{0.2}$ Gate PMOS Devices; vol. 20., No. 1., Jan. 1999.

* cited by examiner

Primary Examiner—Matthew Smith
Assistant Examiner—Calvin Lee
(74) Attorney, Agent, or Firm—Westerman, Hattori, Daniels & Adrian, LLP

(57) ABSTRACT

A method of manufacturing a CMOS semiconductor device able to reduce the effective thickness of the gate insulating film and able to secure stable performance is provided. The method in one embodiment comprises the steps of: forming a polycrystalline silicon film on a gate insulating film; introducing an n-type impurity into the polycrystalline silicon film in an nMOS formation region before gate processing of the polycrystalline silicon film; performing heat treatment so that the impurity diffuses in the polycrystalline silicon film and is activated; and patterning the polycrystalline silicon to form a gate pattern before introducing an impurity into the polycrystalline silicon film at a pMOS formation region.

19 Claims, 4 Drawing Sheets

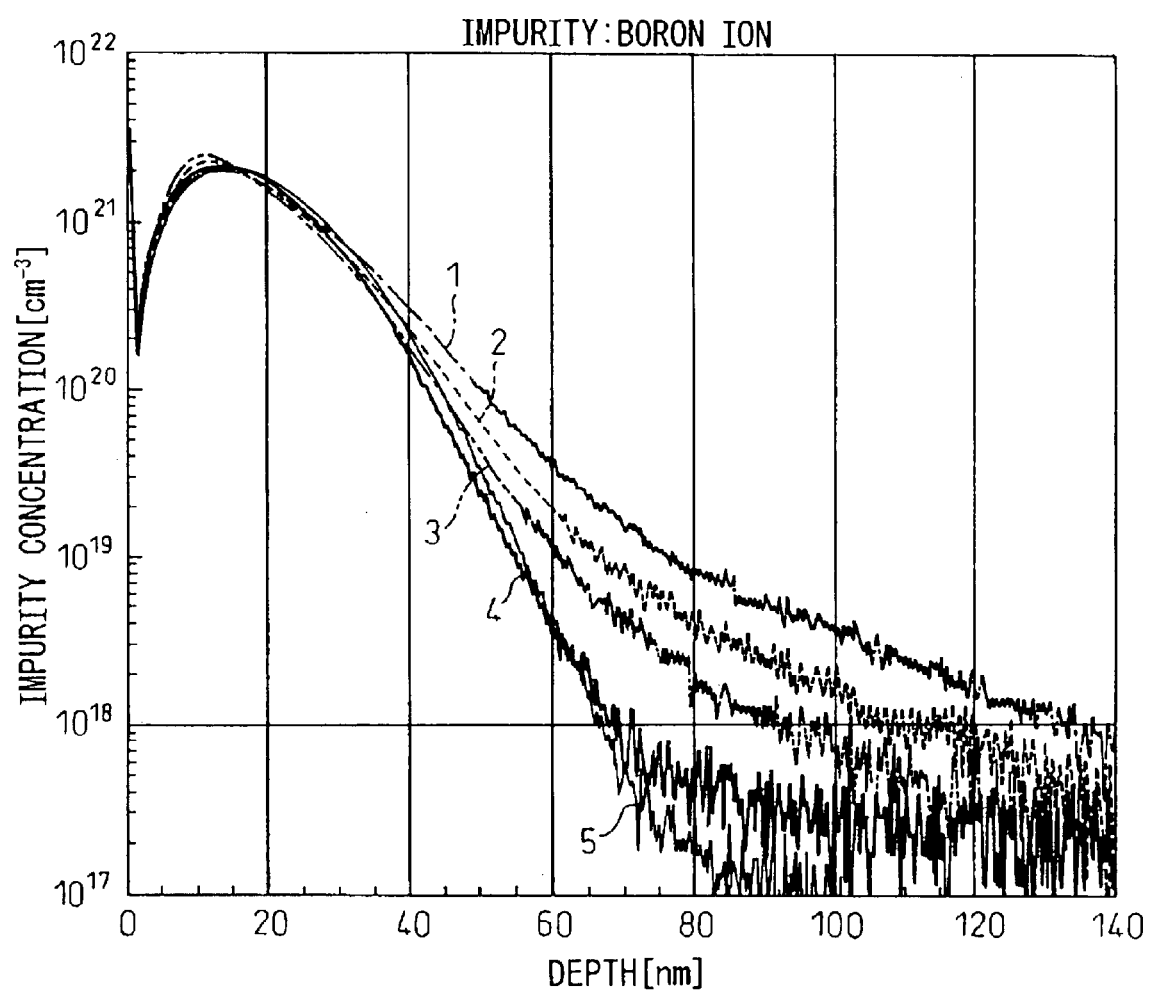

Ge IMPLANTATION→P IMPLANTATION

Ge IMPLANTATION→P IMPLANTATION

Ge IMPLANTATION+B IMPLANTATION

METHOD OF MANUFACTURING CMOS SEMICONDUCTOR DEVICE

BACKGROUND OF THE INVENTION

1. Field of the Invention

The present invention relates to a method of manufacturing a semiconductor device, more particularly relates to a method for manufacturing a CMOS semiconductor device which sufficiently activates an impurity introduced into a polycrystalline silicon gate electrode and reduces an effective thickness of the gate insulating film.

2. Description of the Related Art

The increasing miniaturization of CMOS transistors has led to demand for a shallower junction between the source region and drain region. To obtain such a shallower junction, it is required that ions be implanted with a low energy and the activation annealing be performed at a lower temperature and in a shorter time than the past. When using polycrystalline silicon as a gate electrode, if annealing at a low temperature for a short time, the impurity implanted into the polycrystalline silicon gate electrode is not sufficiently activated. Therefore, the gate electrode becomes depleted and the effective thickness of the gate insulating film becomes greater resulting in the problem of the performance of the CMOS transistor dropping. To solve this problem, Japanese Unexamined Patent Publication (Kokai) No. 6-310666 (in particular the claims and paragraph) discloses a method of manufacturing a CMOS transistor using predoping for introducing an impurity into a gate electrode formation material in advance before processing to the shape of the gate electrode. This publication describes to form a polycrystalline silicon film on a gate oxide film, implant boron (B) ions into the region of the polycrystalline silicon film for forming the p-type gate electrode (pMOS formation region), implant phosphorus (P) ions into the region of the polycrystalline silicon film for forming the n-type gate electrode (nMOS formation region), perform activation annealing at these regions simultaneously, then process them to form gate electrode shapes. The activation annealing is performed specifically at about 850° C. for 30 minutes in a nitrogen atmosphere. However, when annealing for such a long time, the predoped boron migrates from the gate electrode through the gate oxide film to the substrate side. The so-called "boron penetration" phenomenon occurs. This boron penetration ends up causing the performance of the transistor to drop. In this way, while it is desirable to apply sufficient heat for annealing in order to activate the predoped material, if too much heat is added, boron penetration ends up occurring. Improvement of the activation and boron penetration are in a trade-off relationship resulting in a narrow margin of processing and difficult production.

Further, the gate width of the gate electrode has to be made narrower to miniaturize a CMOS transistor. If the gate width becomes narrower, the resultant roughness of the gate shape will lead to variations in the transistor characteristics. Further, it is known that with predoping, the roughness of the gate shape also becomes larger. This increase in roughness is particularly remarkable at the n-type gate electrode side (for example, see Sugatani, S. et al., "Requirements for Dry Process of 100 nm Node CMOS Integration", *Dry Process International Symp.* 2002, pp. 255–262).

SUMMARY OF THE INVENTION

An object of the present invention is to provide a method of manufacturing a CMOS semiconductor device using predoping to introduce an impurity into a polycrystalline gate electrode so as to sufficiently activate the impurity by a broad margin process and thereby reduce the effective thickness of the gate insulating film and enable stable performance.

According to a first aspect of the present invention, there is provided a method of manufacturing a CMOS semiconductor device comprising the steps of: forming a polycrystalline silicon film on a gate insulating film; introducing an n-type impurity into the polycrystalline silicon film in an nMOS formation region before gate processing of the polycrystalline silicon film; performing heat treatment so that the impurity diffuses in the polycrystalline silicon film and is activated; and patterning the polycrystalline silicon to form a gate pattern before introducing an impurity into the polycrystalline silicon film at a pMOS formation region.

In such a method of manufacturing a CMOS semiconductor device, since the gate electrode formation region is predoped only at the nMOS formation region, there is no need to consider depletion of the impurity at the pMOS formation region and it is possible to perform heat treatment for sufficient activation of the impurity. As a result, it is possible to reduce the effective thickness of the gate insulating film and possible to suppress roughness of the gate electrode and produce a semiconductor device with stable performance.

According to a second aspect of the present invention, there is provided a method of manufacturing a CMOS semiconductor device comprising the steps of: forming a polycrystalline silicon film on a gate insulating film; introducing an n-type impurity into the polycrystalline silicon film in an nMOS formation region before gate processing of the polycrystalline silicon film; performing a first heat treatment so that the impurity diffuses in the polycrystalline silicon film and is activated; introducing a p-type impurity into the polycrystalline silicon film at a pMOS formation region before gate processing; and performing a second heat treatment at a higher temperature for a shorter time than the first heat treatment.

In such a method of manufacturing a CMOS semiconductor device, the gate electrode formation region is predoped at the nMOS formation region, first heat treatment is performed for sufficient activation of the impurity, then the gate electrode formation material at the pMOS formation region is predoped. Therefore, there is no need to consider depletion of the impurity at the pMOS formation region and it is possible to obtain effects similar to those of the first aspect of the invention.

Further, by introducing an impurity into the gate electrode formation material at the pMOS formation region and performing second heat treatment, the PMOS formation region is activated. Further, the second heat treatment is performed at a higher temperature for a shorter time than the first heat treatment, so it is possible to suppress depletion of the p-type impurity becoming a problem at the pMOS formation region and possible to obtain a CMOS semiconductor device with a superior performance overall.

BRIEF DESCRIPTION OF THE DRAWINGS

These and other objects and features of the present invention will become clearer from the following description of the preferred embodiments given with reference to the attached drawings, wherein:

FIG. 2 shows the relationship between depth and concentration when implanting boron ions as an impurity into a silicon film;

DESCRIPTION OF THE PREFERRED EMBODIMENTS

Figure 1:
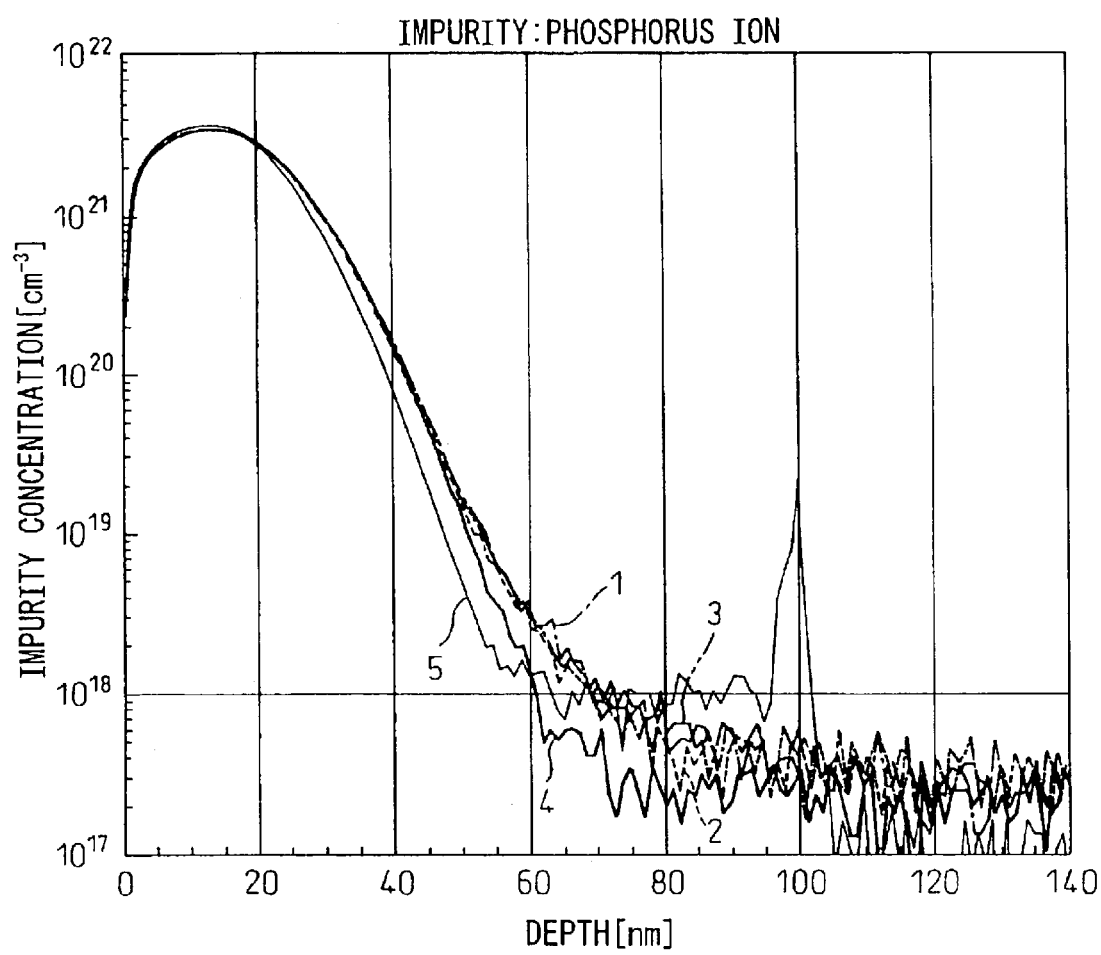
FIG. 1 shows the relationship between depth and concentration when implanting phosphorus ions as an impurity into a silicon film.

One characteristic of the present invention is the introduction of an n-type impurity into a polycrystalline silicon film on the gate insulating film at only an nMOS formation region in the state without an impurity introduced into a pMOS formation region of the polycrystalline silicon film and then performing heat treatment (gate annealing). Therefore, there is no need to consider depletion of the p-type impurity at the pMOS formation region and it is possible to perform gate annealing under conditions suitable for the nMOS formation region.

Further, next, the p-type impurity may be introduced into the pMOS formation region side and gate annealing performed. In this case, since this is done after the gate annealing at the nMOS formation region side so that that region is already sufficiently activated, it is possible to perform gate annealing under conditions suitable for the pMOS formation region side. In this way, it is possible to adjust the gate annealing at the nMOS formation region and the gate annealing at the PMOS formation region independently to obtain the optimal conditions.

As explained above, the n-type impurity is introduced into the polycrystalline silicon film at only the nMOS formation region (first gate annealing). By doing this, the limitation of having to consider impurity penetration at the pMOS formation region is lifted and a broad margin process becomes possible. Therefore, at the nMOS formation region, it is possible to perform gate annealing under conditions enabling the impurity to sufficiently diffuse and be activated. The sufficient activation of the impurity enables depletion of the gate electrode to be suppressed and as a result an increase in the effective thickness of the gate insulating film to be suppressed. Further, due to the sufficient gate annealing, the impurity can sufficiently diffuse and the problem of roughness (deterioration of shape of processing) which could occur when processing a gate, which is a particular problem in an n-type gate electrode, is eliminated—resulting in a semiconductor device with a stable performance. The method of gate annealing at the nMOS formation region is not particularly limited so long as the introduced impurity can be sufficiently diffused and activated. Annealing may be performed in an oven, or annealing may be performed by a rapid thermal annealing system (RTA). The gate annealing at the nMOS formation region is preferably annealing in an oven since this enables the impurity to be reliably diffused in the polycrystalline silicon. The gate annealing in the nMOS formation region, while not limited, generally may be performed at 850 to 1050° C. for 3 seconds to 20 minutes.

On the other hand, if predoping the gate electrode in the pMOS formation region as well, after the introduction of the impurity and the first gate annealing at the nMOS formation region explained above, a p-type impurity is introduced into the pMOS region and second gate annealing is performed under conditions not causing impurity penetration. In this case, the second gate annealing at the pMOS formation region is performed at a higher temperature for a shorter time than the first gate annealing at the nMOS region for preventing impurity penetration. The second gate annealing at the pMOS formation region is not particularly limited, but may be performed at a high temperature of 1000° C. or more for 0 second to several seconds (for example, 10 seconds). For this gate annealing, a rapid thermal annealing system (RTA) may be suitably used.

When introducing an impurity into a polycrystalline silicon film, it is necessary to set conditions enabling sufficient introduction of the impurity while considering the thickness of the substrate so that the impurity does not pass through the polycrystalline silicon film and gate insulating film and into the substrate side. On the other hand, along with the miniaturization of CMOS semiconductor device, the thickness of the substrates is being required to be reduced further. Therefore, it is preferable to implant a sufficient quantity of the impurity shallowly into the polycrystalline silicon film. FIG. 1 shows the relationship between the implantation depth and the impurity concentration when implanting phosphorus ions into a silicon film predoped with germanium (Ce) under various conditions, while FIG. 2 shows the relationship between the implantation depth and impurity concentration when implanting boron ions as an impurity into a silicon film. Note that the conditions of implantation of germanium shown are 1. no implantation of Ge into the polycrystalline silicon film, 2. implantation of Ge into the polycrystalline film by an energy of 5 kev and a dosage of $1 \times 10^{15}/cm^2$, 3. implantation of Ge into the polycrystalline film by an energy of 10 kev and a dosage of $1 \times 10^{15}/cm^2$, 4. implantation of Ge into the polycrystalline film by an energy of 20 keV and a dosage of $1 \times 10^{15}/cm^2$, and 5. amorphous silicon. From FIGS. 1 and 2, it is learned that the tail at the implantation depth can be suppressed when predoping germanium (Ge) and preamorphizing the polycrystalline silicon. This is most remarkable when the silicon film is amorphous silicon. By preamorphizing the polycrystalline silicon in this way, it becomes possible to implant a larger amount of impurity into a certain thickness of polycrystalline silicon film (gate electrode). Further, it is possible to reduce the thickness of the polycrystalline silicon film (gate electrode) for a certain amount of impurity. In particular, shallow implantation is possible when the gate electrode is comprised of amorphous silicon. In this way, it is also possible to use amorphous silicon instead. of polycrystalline silicon as the gate electrode material.

When performing the gate annealing, first gate annealing, or second gate annealing, if the surface of the polycrystalline silicon film is exposed, the impurities introduced into the polycrystalline silicon film may end up diffusing from the surface to the outside. Therefore, it is preferable to perform the gate annealing in an oxygen atmosphere to form an oxide film on the surface of the polycrystalline silicon film in order to prevent outward diffusion. Further, it is more preferable to form an oxide film in advance by a temperature of 600° C. or less where the implantation layer (amorphous layer) or polycrystalline silicon (including amorphous silicon) will not grow so as to prevent outward diffusion. This is because crystal growth of polycrystalline silicon would obstruct activation of the impurities.

In processing to form the shapes of the gate electrodes, generally a hard mask is used to form miniature patterns. As the hard mask, it is possible to use an $SiO_2$ film, but if trying to form a hard mask of a sufficient thickness by CVD etc., sometimes the polycrystalline silicon film is exposed to a high temperature of 600° C. or more. In such a case, as explained above, sometimes the activation of the impurities is obstructed. Therefore, the hard mask is preferably formed after the gate annealing.

The gate insulating film is not particularly limited. An oxide film or an oxynitride film may be used. If trying to prevent impurity penetration at the pMOS gate electrode, however, use of an oxynitride film is preferable. However, an oxynitride film sometimes results in deterioration of mobility and deterioration of the performance of the semiconductor device. Therefore, if not predoping the pMOS gate electrode, the margin with respect to impurity penetration at the pMOS gate electrode becomes broader, so it is possible to use such a worry free oxide film.

A CMOS semiconductor device can be produced using steps known in the past such as implantation of impurities into the extension regions of the nMOS formation region and PMOS formation region after gate processing, formation of oxide film spacers at the side walls of the gate electrodes, implantation of impurities at the source-drain regions of the nMOS formation region and pMOS formation region, then activation annealing and finally formation of a silicide layer.

However, the activation annealing after forming the source-drain regions and other activation annealing is preferably performed under conditions where depletion of impurities from the gate electrodes will not occur. Impurity depletion can be prevented if performing this activation annealing by an amount of heat the same as or less than that of the second gate annealing on the pMOS gate electrode. For example, it is possible to perform the activation annealing at a temperature the same as or lower than that of the second gate annealing by a time the same as or shorter than that of the second gate annealing.

Next, the present invention will be explained based on specific embodiments with reference to the drawings.

First Embodiment, Production of CMOS Semiconductor Device by Predoping Only nMOS Region FIGS. 3A to 3F show the flow of steps of production of a CMOS semiconductor device according to a first embodiment of the present invention.

Figure 3A:
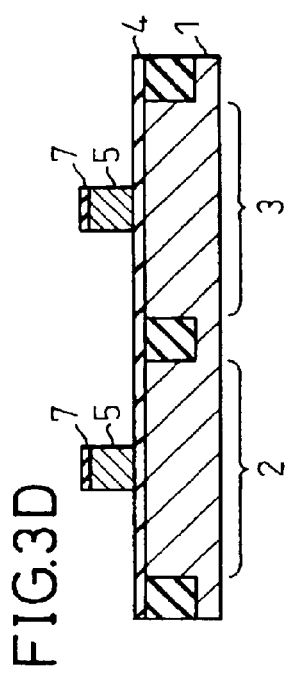
FIGS. 3A to 3F show the flow of steps for manufacturing a CMOS semiconductor device according to an embodiment of the present invention.

A silicon substrate 1 isolated in advance by shallow trench isolation (STI) to form an nMOS region 2 and a pMOS region 3 is formed with a gate insulating film 4 to a thickness of 1.5 nm, then has deposited on it a polycrystalline silicon film 5 for formation of gate electrodes to a thickness of 120 nm (FIG. 3A).

Figure 3B:
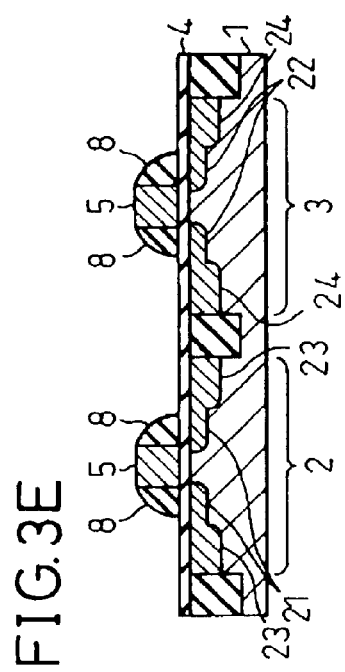

Next, a mask 6 is formed so as to enable an impurity to be introduced into the polycrystalline silicon film 5 at the nMOS region 2, then Ge is introduced by an energy of 20 kev and a dosage of $1\times10^{15}/cm^2$ to preamorphize the polycrystalline silicon film 5. Next, phosphorus (P) ions are introduced by an energy of 10 keV and a dosage of $1\times10^{15}/cm^2$ (FIG. 3B).

Figure 3C:
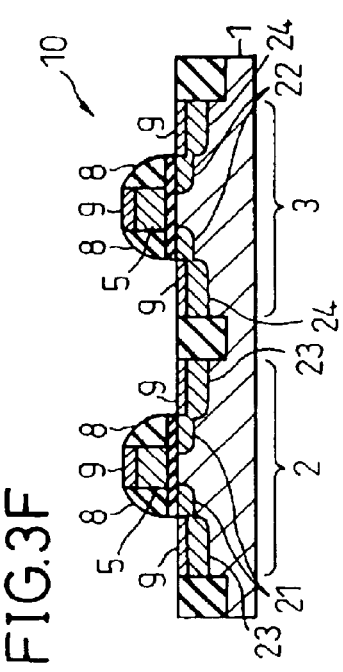

Next, the mask 6 is removed, then the gate is annealed in a rapid thermal annealing system (RTA) at 900° C. for 30 seconds in an oxygen atmosphere, whereby the nMOS region 2 is activated. Next, an oxide film (TEOS) is deposited by CVD as a hard mask 7 for gate processing at 580° C. to 30 nm (FIG. 3C).

Figure 3D:
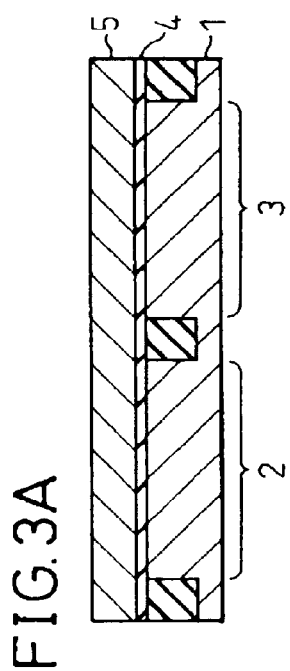

The hard mask 7 is patterned to the shapes of the gate electrodes, then the nMOS region 2 and pMOS region 3 are simultaneously gate processed (FIG. 3D).

Figure 3E:
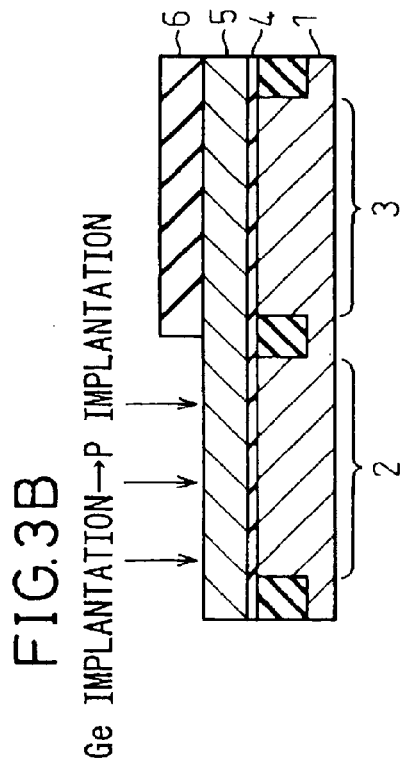

Next, an nMOS extension region 21 is implanted with indium (In) ions as a p-type impurity by an energy of 60 keV and a dosage of $1\times10^{13}/cm^2$ from four directions at 25° four times and is implanted with arsenic (As) ions as an n-type impurity by an energy of 1 keV and a dosage of $1\times10^{15}/cm^2$, a pMOS extension region 22 is implanted with arsenic (As) ions as an n-type impurity by an energy of 65 keV and a dosage of $1\times10^{13}/cm^2$ from four directions at 250 four times and is implanted with boron (B) ions as a p-type impurity by an energy of 0.5 keV and a dosage of $1\times10^{15}/cm^2$, then an oxide film is deposited by CVD at 580° C. to a thickness of 100 nm and etched back to form oxide film spacers 8. Further, an nMOS source-drain region 23 is implanted with phosphorus (P) ions at an energy of 10 keV and a dosage of $4\times10^{15}/cm^2$, the pMOS source-drain region 24 is implanted with boron (B) ions by an energy of 5 keV and a dosage of $4\times10^5/cm^2$, then boron (B) ions are implanted as a p-type impurity into the p-type gate electrode by an energy of 10 keV and a dosage of $1\times10^5/cm^2$. Next, activation annealing is performed at 1050° C. for 0 second (spike annealing) in a nitrogen atmosphere (FIG. 3E).

Figure 3F:
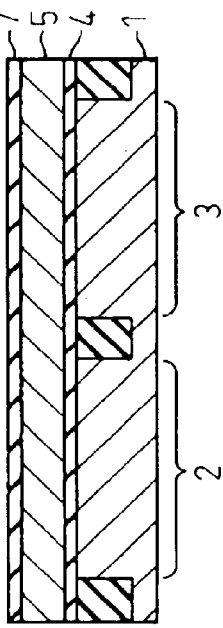

Next, the oxide film of the surface is removed to expose the gate electrode surfaces and the source-drain regions, then a cobalt film is formed by sputtering and a CoSi silicide layer 9 is formed by a salicide process to 20 nm to obtain a CMOS semiconductor device 10 (FIG. 3F).

Second Embodiment, Production of CMOS Semiconductor Device by Predoping nMOS Region and pMOS Region FIGS. 4A to 4G show the flow of steps for production of the present invention.

Figure 4A:
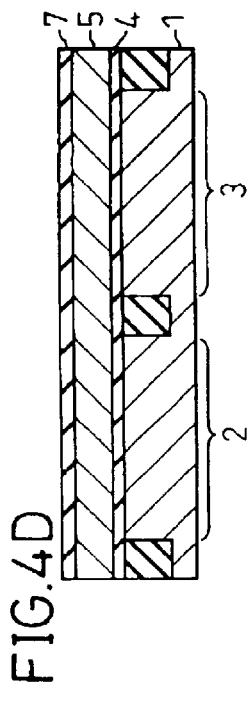
FIGS. 4A to 4G show the flow of steps for producing a CMOS semiconductor device according to another embodiment of the present invention.

A silicon substrate 1 isolated in advance by shallow trench isolation (STI) to form an nMOS region 2 and a pMOS region 3 is formed with a gate insulating film 4 to a thickness of 1.5 nm, then has deposited on it a polycrystalline silicon film 5 for formation of gate electrodes to a thickness of 120 nm (FIG. 4A).

Figure 4B:
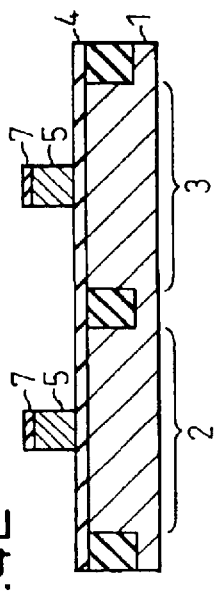

Next, a mask 6 is formed so as to enable an impurity to be introduced into the polycrystalline silicon film 5 at the nMOS region 2, then Ge is introduced by an energy of 20 keV and a dosage of $1\times10^{15}/cm^2$ to preamorphize it. Next, phosphorus (P) ions are introduced by an energy of 10 keV and a dosage of $1\times10^{15}/cm^2$ (FIG. 4B).

Figure 4C:
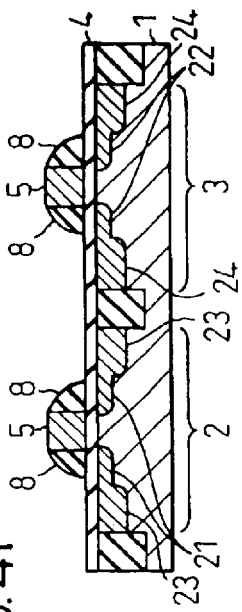

Next, the mask 6 is removed, then the gate is annealed in a rapid thermal annealing system (RTA) at 900° C. for 30 seconds in an oxygen atmosphere, whereby the nMOS region 2 is activated. Next, a mask 6 is formed so as to enable an impurity to be introduced into the pMOS region and Ge is introduced by an energy of 20 keV and a dosage of $1\times10^{15}/cm^2$ to preamorphize it. Next, boron (B) ions are introduced by an energy of 5 keV and a dosage of $1\times10^{15}/cm^2$ (FIG. 4C).

Figure 4D:
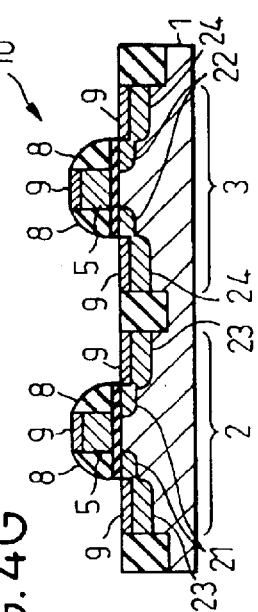

The mask 6 is removed, then a rapid thermal annealing (RTA) system is used for gate annealing at 1050° C. for 0 second (spike annealing) in a nitrogen atmosphere to thereby activate the pMOS region 3. Next, an oxide film (TEOS) is deposited by CVD as a hard mask 7 for gate processing at 580° C. to 30 nm (FIG. 4D).

Figure 4E:
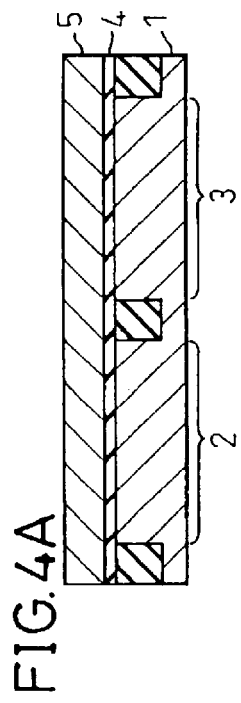

The hard mask 7 is patterned to the shapes of the gate electrodes, then the nMOS region 2 and pMOS region 3 are simultaneously gate processed (FIG. 4E).

Figure 4F:
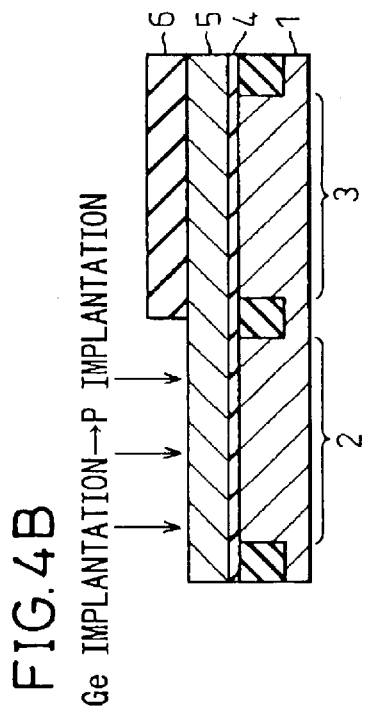

Next, an nMOS extension region 21 is implanted with indium (In) ions as a p-type impurity by an energy of 60 keV and a dosage of $1\times10^{13}/cm^2$ from four directions at 250 four times and is implanted with arsenic (As) ions as an n-type impurity by an energy of 1 keV and a dosage of $1\times10^{15}/cm^2$, a pMOS extension region 22 is implanted with arsenic (As)

ions as an n-type impurity by an energy of 65 kev and a dosage of $1\times10^{13}/cm^2$ from four directions at 25° four times and is implanted with boron (B) ions as a p-type impurity by an energy of 0.5 keV and a dosage of $1\times10^{15}/cm^2$, then an oxide film is deposited by CVD at 580° C. to a thickness of 100 nm and etched back to form oxide film spacers 8. Further, phosphorus (P) ions are implanted into an nMOS source-drain region 23 by an energy of 10 kev and a dosage of $4\times10^{15}/cm^2$ and boron (B) ions are implanted into a pMOS source-drain region 24 by an energy of 5 kev and a dosage of $4\times10^{15}/cm^2$. Next, activation annealing is performed at 1050° C. for 0 second (spike annealing) in a nitrogen atmosphere (FIG. 4F).

Figure 4G:
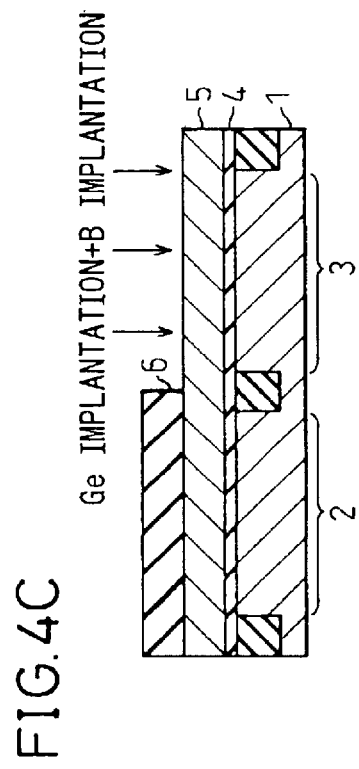

Next, sputtering is performed to form a cobalt film and a salicide process is used to form a CoSi silicide layer 9 to 20 nm and thereby obtain the CMOS semiconductor device 10 (FIG. 4G).

According to the method of manufacturing a CMOS semiconductor device of the present invention, it is possible to reduce the effective thickness of a gate insulating film and possible to produce a semiconductor device with a stable performance.

While the invention has been described with reference to specific embodiments chosen for purpose of illustration, it should be apparent that numerous modifications could be made thereto by those skilled in the art without departing from the basic concept and scope of the invention.

This application is based on and claims priority of Japanese Patent Application No. 2002-381697 filed on Dec. 27, 2002, the contents being incorporated herein by reference.

What is claimed is:

1. A method of manufacturing a CMOS semiconductor device comprising the steps of: forming a polycrystalline silicon film on a gate insulating film; introducing an n-type impurity into the polycrystalline silicon film in an nMOS formation region before gate processing of said polycrystalline silicon film; performing heat treatment so that said impurity diffuses in the polycrystalline silicon film and is activated; and patterning said polycrystalline silicon to form a gate pattern before introducing an impurity into the polycrystalline silicon film at a pMOS formation region.

2. A method of manufacturing a CMOS semiconductor device according to claim 1, wherein said gate insulating film is an oxide film.

3. A method of manufacturing a CMOS semiconductor device according to claim 1, wherein said heat treatment is by oven annealing.

4. A-method of manufacturing a CMOS semiconductor device according to claim 1, wherein said heat treatment is performed in an oxygen atmosphere to form an oxide film on the surface of said polycrystalline silicon film.

5. A method of manufacturing a CMOS semiconductor device according to claim 1, wherein after introducing said impurity into said polycrystalline silicon film and before said heat treatment, an oxide film is grown on the surface of said polycrystalline silicon film at a temperature of not more than 600° C.

6. A method of manufacturing a CMOS semiconductor device according to claim 1, wherein a hard mask for gate processing is formed after said heat treatment.

7. A method of manufacturing a CMOS semiconductor device according to claim 1, wherein before introducing an n-type impurity into the polycrystalline silicon film at said nMOS formation region, Ge is introduced into said polycrystalline silicon film to preamorphize said polycrystalline silicon in the polycrystalline silicon film.

8. A method of manufacturing a CMOS semiconductor device according to claim 1, wherein polycrystalline silicon is replaced by amorphous silicon as the gate electrode material.

9. A method of manufacturing a CMOS semiconductor device comprising the steps of: forming a polycrystalline silicon film on a gate insulating film; introducing an n-type impurity into the polycrystalline silicon film in an nMOS formation region before gate processing of said polycrystalline silicon film; performing a first heat treatment so that said impurity diffuses in the polycrystalline silicon film and is activated; introducing a p-type impurity into the polycrystalline silicon film at a pMOS formation region before gate processing; and performing a second heat treatment at a higher temperature and in a shorter time than said first heat treatment.

10. A method of manufacturing a CMOS semiconductor device according to claim 9, wherein said gate insulating film is an oxynitride film.

11. A method of manufacturing a CMOS semiconductor device according to claim 9, wherein said first heat treatment is by oven annealing.

12. A method of manufacturing a CMOS semiconductor device according to claim 9, wherein said second heat treatment is annealing at a high temperature of at least 1000° C. for a short time of not more than 10 seconds.

13. A method of manufacturing a CMOS semiconductor device according to claim 9, wherein said first heat treatment and second heat treatment are performed in an oxygen atmosphere to form an oxide film on the surface of said polycrystalline silicon film.

14. A method of manufacturing a CMOS semiconductor device according to claim 9, wherein after introducing said n-type impurity or p-type impurity into said polycrystalline silicon film and before said first heat treatment or second heat treatment, an oxide film is grown on the surface of said polycrystalline silicon film at a temperature of not more than 600° C.

15. A method of manufacturing a CMOS semiconductor device according to claim 9, wherein a hard mask for gate processing is formed after said second heat treatment.

16. A method of manufacturing a CMOS semiconductor device according to claim 9, wherein before introducing an n-type impurity into the polycrystalline silicon film at said nMOS formation region, Ge is introduced into said polycrystalline silicon film to preamorphize said polycrystalline film.

17. A method of manufacturing a CMOS semiconductor device according to claim 9, wherein before introducing a p-type impurity into the polycrystalline silicon at said pMOS formation region, Ge is introduced into said polycrystalline silicon film to preamorphize said polycrystalline silicon in the polycrystalline silicon film.

18. A method of manufacturing a CMOS semiconductor device according to claim 9, wherein polycrystalline silicon is replaced by amorphous silicon as the gate electrode material.

19. A method of manufacturing a CMOS semiconductor device according to claim 9, wherein the heat treatment for activation after forming the source and drain is performed by an amount of heat the same or less than said second heat treatment.

* * * * *